United States Patent
Moon

(10) Patent No.: US 7,034,615 B2
(45) Date of Patent: Apr. 25, 2006

(54) CMOS OPERATIONAL AMPLIFIER

(75) Inventor: Hong-Shik Moon, Seoul (KR)

(73) Assignee: LG Electronics Inc., Seoul (KR)

( * ) Notice: Subject to any disclaimer, the term of this patent is extended or adjusted under 35 U.S.C. 154(b) by 5 days.

(21) Appl. No.: 10/757,400

(22) Filed: Jan. 15, 2004

(65) Prior Publication Data

US 2004/0145413 A1    Jul. 29, 2004

(30) Foreign Application Priority Data

Jan. 20, 2003 (KR) .............. 10-2003-0003639

(51) Int. Cl.
*H03F 3/45* (2006.01)
(52) U.S. Cl. ........................ 330/253; 330/252
(58) Field of Classification Search ........ 330/252–257, 330/263, 264

See application file for complete search history.

(56) References Cited

U.S. PATENT DOCUMENTS

| | | | | |
|---|---|---|---|---|
| 4,893,092 A | * | 1/1990 | Okamoto | 330/253 |
| 5,581,212 A | * | 12/1996 | Huang et al. | 330/253 |
| 6,392,485 B1 | * | 5/2002 | Doi et al. | 330/253 |
| 6,781,460 B1 | * | 8/2004 | Crain et al. | 330/253 |
| 6,801,080 B1 | * | 10/2004 | Arcus | 327/563 |
| 6,822,513 B1 | * | 11/2004 | Li et al. | 330/253 |

\* cited by examiner

*Primary Examiner*—Linh V. Nguyen
(74) *Attorney, Agent, or Firm*—Birch Stewart Kolasch & Birch LLP

(57) ABSTRACT

A CMOS (Complementary Metal Oxide Semiconductor) operational amplifier includes: an amplifying unit for differentially amplifying signals inputted to an inverting input terminal and non-inverting input terminal to reduce an input offset voltage and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal.

23 Claims, 1 Drawing Sheet

CMOS OPERATIONAL AMPLIFIER

This Nonprovisional application claims priority under 35 U.S.C. § 119(a) on Patent Application No(s). 10-2003-0003639 filed in KOREA on Jan. 20, 2003, the entire contents of which are hereby incorporated by reference.

BACKGROUND OF THE INVENTION

1. Field of the Invention

The present invention relates to a semiconductor integrated circuit and, more particularly, to a CMOS (Complementary Metal Oxide Semiconductor) operational amplifier.

2. Description of the Background Art

In general, in order to make each pixel be radiated to desired colors, display devices displaying images through an LCD (Liquid Crystal Display) use a driving IC (Integrated Circuit) driving each pixel of the LCD to a gray level of red (R), green (G) and blue (B) corresponding to the desired colors.

Especially, unlike a PDP (Plasma Display Panel) in which a gray level is selected by the width of high or low intervals of a pulse like a pulse width modulation method, in the driving IC driving the LCD of a voltage driving method in which a gray level is selected by a voltage level, each pixel of the LCD connected to each output channel is operated as a gray level of R, G and B which correspond to a desired color.

Among display devices using the LCD, an LCD monitor or an LCD television receiver does not require a high speed driving IC because as many pixels as needed for the resolution are constructed in a matrix form and one driving channel is connected to each pixel. Thus, it is not difficult to design or fabricate the driving IC of the display devices.

However, in case of an LCD projection display device which forms a large screen in a projection method, since the driving channels that can be connected to the high resolution LCD are limited, the driving channels should be multiplexed at a high speed so as to be driven.

Thus, the driving IC used for the projection display device requires a faster driving speed for multiplexing the driving channels than the driving speed of the driving ICs used for the LCD monitor or the LCD television receiver. Herein, an output voltage of the driving IC used for the LCD projection display device is generally in the range of about 10V~15V.

In order to satisfy all the conditions, it is advantageous that the driving IC is implemented as a bipolar junction transistor (BJT), which has a quick fabrication process. Thus, generally, the driving IC is implemented as the BJT which can be driven at a high speed while satisfying the range of the high output voltage.

However, such a driving IC has the following problems. That is, the conventional BJT operational amplifier with the driving IC incurs a high fabrication cost and it is difficult to integrate the BJT operational amplifier together with other IC implemented as the currently commercialized CMOS.

In addition, a generally used conventional 2-stage CMOS operational amplifier, which has been implemented as the CMOS to solve the problems, also has problems that it can hardly charge or discharge a large-capacity capacitive load at a high speed and an input offset voltage among driving channels can be increased.

SUMMARY OF THE INVENTION

Therefore, one object of the present invention is to provide a CMOS operational amplifier capable of reducing a fabrication cost of a product by implementing an amplifying unit for differentially amplifying signals inputted to an inverting input terminal and non-inverting input terminal to reduce an input offset voltage through a plurality of CMOSs and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal.

Another object of the present invention is to provide a CMOS operational amplifier capable of being easily integrated along with other ICs implemented through the CMOS by implementing an amplifying unit for differentially amplifying signals inputted to an inverting input terminal and non-inverting input terminal to reduce an input offset voltage through a plurality of CMOSs and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal.

Still another object of the present invention is to provide a CMOS operational amplifier capable of driving a large-capacity capacitive load at a high speed by implementing an amplifying unit for differentially amplifying signals inputted to an inverting input terminal and non-inverting input terminal to reduce an input offset voltage through a plurality of CMOSs and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal.

Yet another object of the present invention is to provide a CMOS operational amplifier capable of minimizing an input offset voltage among driving channels by implementing an amplifying unit for differentially amplifying signals inputted to an inverting input terminal and non-inverting input terminal to reduce an input offset voltage through a plurality of CMOSs and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal.

To achieve these and other advantages and in accordance with the purpose of the present invention, as embodied and broadly described herein, there is provided a CMOS operational amplifier including: an amplifying unit for differentially amplifying signals inputted to an inverting input terminal and non-inverting input terminal to reduce an input offset voltage and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incor- In the drawings.

DETAILED DESCRIPTION OF THE PREFERRED EMBODIMENTS

Figure 1:
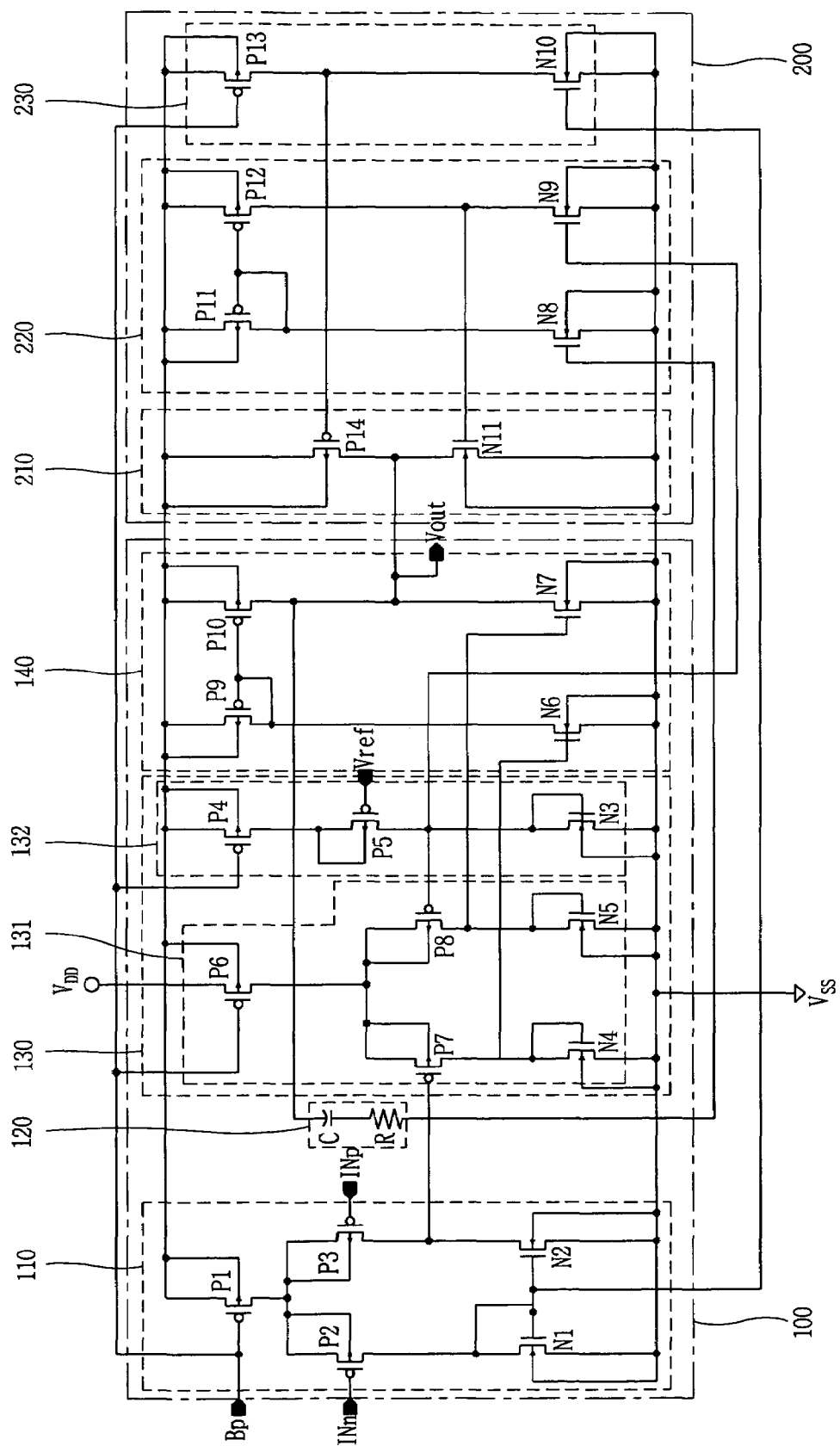
FIG. 1 is a circuit diagram showing a construction of a CMOS operational amplifier in accordance with the present invention.

Reference will now be made in detail to the preferred embodiments of the present invention, examples of which are illustrated in the accompanying drawings.

A CMOS operational amplifier capable of reducing a fabrication cost of a product, being easily integrated along with other ICs implemented through the CMOS, driving a large-capacity capacitive load at a high speed and minimizing an input offset voltage among driving channels, by implementing an amplifying unit for differentially amplifying signals inputted to an inverting input terminal and non-inverting input terminal to reduce an input offset voltage through a plurality of CMOSs and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal, in accordance with a preferred embodiment of the present invention will now be described with reference to the accompanying drawing.

FIG. 1 is a circuit diagram showing a construction of a CMOS operational amplifier in accordance with the present invention.

As shown in FIG. 1, the CMOS operational amplifier includes: an amplifying unit 100 for amplifying signals inputted to an inverting input terminal (INn) and non-inverting input terminal (INp) to reduce an input offset voltage and outputting the amplified signal to an output terminal; and a slew enhancing unit 200 for increasing a slew rate of the amplified signal outputted to the output terminal on the basis of the voltage value of the inverting input terminal and the voltage value of the non-inverting input terminal.

The amplifying unit 100 includes: a first differential amplifier 110 for differentially amplifying a signal inputted to the inverting input terminal (INn) and the non-inverting input terminal (INp); a symmetrical amplifier 130 for generating a signal symmetrical to the signal outputted from the non-inverting output terminal of the first differential amplifier 110 and differentially amplifying the generated signal and the signal outputted from the non-inverting output terminal of the first differential amplifier; an amplified signal output unit 140 for differentially amplifying signals inputted from an inverting output terminal and a non-inverting output terminal of the symmetrical amplifier 130 and outputting the amplified signals to the output terminal; and a compensator 120 for guaranteeing a frequency stability through a frequency compensation of the amplifier between the non-inverting output terminal of the first differential amplifier 110 and the output terminal ($V_{out}$).

The symmetrical amplifier 130 includes an input symmetry unit 132 for generating a signal symmetrical to the signal outputted from the non-inverting output terminal of the first differential amplifier 110 and outputting the generated signal; and a second differential amplifier 131 for differentially amplifying the signal outputted from the non-inverting output terminal of the first differential amplifier 110 and the signal generated by the input symmetry unit 132.

The slew enhancing unit 200 includes a discharge controller 220 for generating a signal for discharging a current charged in a capacitive load connected to the output terminal on the basis of the signal outputted from the non-inverting output terminal of the first differential amplifier 110 and the signal generated by the symmetry amplifier 130; a charge controller 230 for generating a signal for charging a current to the capacitive load connected to the output terminal on the basis of the signal outputted from the inverting output terminal of the first differential amplifier 110; and a discharge/charge driving unit 210 for discharging a current charged in the capacitive load connected to the output terminal or charging a current to the capacitive load on the basis of the signals generated from the discharge controller 220 and the charge controller 230.

The construction of the operational amplifier constructed as described above will now be explained in detail.

First, the first differential amplifier 110 includes PMOS (P-channel Metal Oxide Semiconductor) transistors (P1, P2 and P3) and NMOS (N-channel Metal Oxide Semiconductor) transistors (N1 and N2), and differentially amplifies a signal inputted to the inverting input terminal (INn) and the non-inverting input terminal (INp).

The symmetry amplifier 130, including PMOS transistors (P4, P5, P6, P7 and P8) and NMOS transistors (N3, N4 and N5), generates a signal symmetrical to the signal outputted from the non-inverting output terminal of the first differential amplifier 110 and differentially amplifies the generated symmetrical signal and the signal outputted from the non-inverting output terminal of the first differential amplifier 110.

In other words, the input symmetry unit 132 includes the PMOS transistors P4 and P5 and the NMOS transistor N3 and amplifies a reference voltage ($V_{ref}$), a common voltage of the signals inputted to the inverting input terminal (INn) and to the non-inverting input terminal (INp) to generate a signal symmetrical to the signal outputted from the non-inverting output terminal of the first differential amplifier 110, and the second differential amplifier 131 includes the PMOS transistors P6, P7 and P8 and the NMOS transistors N4 and N5 and differentially amplifies the signal outputted from the non-inverting output terminal of the first differential amplifier 110 and the signal generated by the input symmetry unit 132.

The amplified signal output unit 140, including PMOS transistors P9 and P10 and NMOS transistors N6 and N7, differentially amplifies the signals outputted from the inverting output terminal and the non-inverting output terminal of the second differential amplifier 131 and outputs the differentially amplified signals to the output terminal ($V_{out}$).

The compensator 120, including a resister (R) positioned between the non-inverting output terminal of the first differential amplifier 110 and the output terminal ($V_{out}$) and a condenser (C) connected in series to the resister, guarantees a frequency stability through a frequency compensation of the amplifying unit 100.

The discharge controller 220, including PMOS transistors P11 and P12 and NMOS transistors N8 and N9, generates a signal for discharging a current charged in the capacitive load connected to the output terminal on the basis of the signal outputted from the non-inverting output terminal of the first differential amplifier 110 and the signal generated by the symmetry amplifier 130.

The charge controller 230, including a PMOS transistor P13 and an NMOS transistor N10, generates a signal for charging a current to the capacitive load connected to the output terminal on the basis of the signal outputted from the inverting output terminal of the first differential amplifier 110.

The discharge/charge driving unit 210, including a PMOS transistor P14 and an NMOS transistor N11, discharges a current charged in the capacitive load connected to the output terminal or charges a current on the basis of signals generated from the discharge controller 220 and the charge controller 230.

The operational principle of the operational amplifier will now be described.

First, non-inverting operational power ($V_{DD}$), inverting operational power ($V_{SS}$) and a bias reference voltage (Bp) are applied to the amplifying unit 100.

The PMOS transistors (P2 and P3) of the first differential amplifier 110 differentially amplify a differential input signal inputted to the inverting input terminal (INn) and the non-inverting input terminal (INp), and the signal outputted from the non-inverting output terminal of the first differential amplifier 110 is inputted to the PMOS transistor P7 of the second differential amplifier 131.

At this time, the input symmetry unit 132 amplifies the reference voltage ($V_{ref}$) to generate a signal symmetrical to the signal outputted from the non-inverting output terminal of the first differential amplifier 110.

The second differential amplifier 131 differentially amplifies the symmetrical signal generated from the input symmetry unit 132 and the signal outputted from the non-inverting output terminal of the first differential amplifier 110.

Accordingly, the amplified signal output unit 140 outputs the input offset voltage-reduced signal to the output terminal ($V_{out}$) on the basis of the differentially amplified signal.

The principle of reducing the input offset voltage is as follows.

In general, the input offset voltage of the CMOS operational amplifier means a voltage to be applied to the two input terminals to make a difference between an applied input voltage and an output voltage zero in a unity gain feedback connection structure in which the inverting input terminal and the output terminal are connected to make an output signal be the same as an input signal, and appears as the sum of a random offset voltage generated due to characteristics mismatching of two differential input transistors connected to the inverting input terminal (INn) and the non-inverting input terminal (INp) and a systematic offset voltage generated due to a difference in drain voltages of the differential input transistors.

In order to obtain a sufficient gain, the general CMOS operational amplifier has such a form of an active load connected to a drain of the differential input transistor that a gate and a drain of one of the transistors constituting the active load are connected and the other one is connected to a current mirror. That is, in the two transistors, only the gate is commonly connected.

In such a general CMOS operational amplifier, a drain voltage of the two differential input transistors are not balanced and an output resistance of a drain of the differential input transistor of which a gate and the drain are not connected is high. Thus, in order to obtain a high amplification gain, the differential input transistor is directly connected to an output terminal, and in this case, a problem arises that the input offset voltage is amplified and outputted to the output terminal.

In order to solve the problem, the CMOS operational amplifier in accordance with the present invention is constructed such that the second differential amplifier 131 consisting of the NMOS transistors N4 and N5 which are operated as a diode by connecting the gate and the drain and the input symmetry unit 132 consisting of the PMOS transistors P4 and P5 and the NMOS transistor N3 are implemented between the first differential amplifier 110 and the amplified signal output unit 140. Herein, the input symmetry unit 132 applies a common voltage of the input signals of the first differential amplifier 110 to the reference voltage ($V_{ref}$), so that the two input signals of the second differential amplifier 131 can be completely symmetrical to each other.

Accordingly, in the CMOS operational amplifier in accordance with the present invention, an output signal of the first differential amplifier 110 is inputted to the second differential amplifier 131 and an output signal of the NMOS transistors N4 and N5 operating as an active load of the second differential amplifier 131, that is, as a diode, is inputted symmetrically to the NMOS transistors N6 and N7 of the amplified signal output unit 140, so that the amplified signal output unit 140 is balancedly driven, and thus, a sufficient gain can be obtained while reducing the input offset voltage.

Meanwhile, the CMOS operational amplifier in accordance with the present invention, since the large-capacity capacitive load of about at least 100 pF (Pico-Farad) is connected to the output terminal ($V_{out}$) of the amplifying unit 100, a frequency stability of the CMOS operational amplifier is determined by the large-capacity capacitive load connected to the output terminal ($V_{out}$).

However, in order to drive the large-capacity capacitive load at a high speed with a voltage of about at least 10V, a high output current is required. That is, in the general CMOS operational amplifier, in order to output a high current, the size of an output transistor needs to be increased for a capability of driving a high output current with a high power consumption, AC characteristics, small signal characteristics of the CMOS operational amplifier, are degraded, causing a problem that a sufficient operation speed is not obtained. Herein, the capacitive load means the large-capacity capacitive load such as each pixel of the LCD.

Thus, in order to solve the problem, the CMOS operational amplifier in accordance with the present invention includes the slew enhancing unit 200 at the output terminal ($V_{out}$) in order to increase a slew rate of a signal amplified by the amplifying unit 100 on the basis of an input voltage value of the inverting input terminal and an input voltage value of the non-inverting input terminal. Herein, the slew rate means a change rate of an output voltage per certain time.

In the slew enhancing unit 200 of the CMOS operational amplifier in accordance with the present invention, the PMOS transistor P14 and the NMOS transistor N11 of the discharge/charge driving unit 210 control driving of the capacitive load connected to the output terminal ($V_{out}$) on the basis of the input voltage value of the inverting input terminal (INn) and the input voltage value of the non-inverting input terminal (INp). At this time, the PMOS transistor P14 is controlled by the PMOS transistor P13 and the NMOS transistor N10 of the charge controller 230, and the NMOS transistor N11 is controlled by the PMOS transistors P11 and P12 and the NMOS transistors N8 and N8 of the discharge controller 220.

The operational principle of the slew enhancing unit 200 is as follows.

First, the charge controller 230 includes a PMOS transistor P13 operating as a current source providing a certain current and having a gate to which the bias reference voltage (Bp) is applied, and an NMOS transistor N10 having a gate to which the inverting output terminal of the first differential amplifier 110 is connected.

A voltage of a contact point of the PMOS transistor P13 and the NMOS transistor N10 is determined by a difference between a current flowing to the PMOS transistor P13 and a current flowing to the NMOS transistor N1.

At this time, if the input voltage value of the non-inverting input terminal INp is greater than the input voltage value of the inverting input terminal (INn) and a voltage difference between the non-inverting input terminal (INp) and the inverting input terminal (INn) is smaller than a prescribed voltage, an even larger amount of current flows to the PMOS transistor P13 than to the NMOS transistor N10. Accordingly, the voltage at the contact point of the PMOS transistor P13 and the NMOS transistor N10 has a level close to the non-inverting operation power ($V_{DD}$) and the PMOS transistor P14 of the discharge/charge driving unit 210 is opened.

Meanwhile, if the input voltage value of the non-inverting input terminal (INp) is greater than the input voltage value of the inverting input terminal (INn) and a voltage difference between the non-inverting input terminal (INp) and the inverting input terminal (INn) is greater than a prescribed voltage, a voltage of the inverting output terminal of the first differential amplifier 110 is instantly increased. Then, the NMOS transistor N10 of the charge controller 230 becomes short and a high current flow thereto, so that the voltage of contact point of the PMOS transistor P13 and the NMOS transistor N10 is decreased to the level of the inverting operation power ($V_{SS}$). Accordingly, the current is outputted to the output terminal ($V_{out}$) through the PMOS transistor P14 and quickly charged to the capacitive load connected to the output terminal ($V_{out}$).

At this time, since the CMOS operational amplifier in accordance with the present invention is used as an output buffer for driving the large-capacity capacitive load in the driving IC and connected in a unity gain feedback form as the inverting input terminal and the output terminal are connected, the current is charged into the capacitive load connected to the output terminal ($V_{out}$), so the voltage of the output terminal ($V_{out}$) is increased and thus the voltage difference between the non-inverting input terminal (INp) and the output terminal ($V_{out}$) is reduced. Accordingly, since the voltage at the contact point of the PMOS transistor P13 and the NMOS transistor N10 is lowered again, the PMOS transistor P14 is opened.

The discharge controller 220 includes the NMOS transistor N9 operating as a current source for providing a certain current as the output voltage of the input symmetry unit 132 is applied to the gate, the NMOS transistor N8 having a gate connected to the non-inverting output terminal of the first differential amplifier 110, and the PMOS transistors P11 and P12 operating as a current mirror.

At this time, when the input voltage value of the inverting input terminal (INn) is greater than the input voltage value of the non-inverting input terminal (INp) and the voltage difference between the inverting input terminal (INn) and the non-inverting input terminal (INp) is smaller than a predetermined voltage, the more current flows to the NMOS transistor N9 than flows to the PMOS transistor P12, so a low voltage is applied to the gate of the NMOS transistor N11 and thus the NMOS transistor N11 is opened.

Meanwhile, when the input voltage value of the inverting input terminal (INn) is greater than the input voltage value of the non-inverting input terminal (INp) and the voltage difference between the inverting input terminal (INn) and the non-inverting input terminal (INp) is greater than a predetermined voltage, the gate voltage of the NMOS transistor N8 is increased. Then, the current flowing to the PMOS transistor P12 is rapidly increased and a very high voltage is applied to the gate of the NMOS transistor N11, making the NMOS transistor N11 short. Accordingly, the current charged in the capacitive load of the output terminal ($V_{out}$) is quickly discharged through the NMOS transistor N11.

In this manner, the slew enhancing unit 200 of the CMOS operational amplifier in accordance with the present invention can drive the capacitive load at a high speed by quickly charging or discharging the current to and from the large-capacity capacitive load connected to the output terminal ($V_{out}$).

As so far described, the CMOS operational amplifier in accordance with the present invention has the following advantages.

That is, by implementing an amplifying unit for differentially amplifying signals inputted to an inverting input terminal and non-inverting input terminal to reduce an input offset voltage through a plurality of CMOSs and outputting the amplified signal to an output terminal; and a slew enhancing unit for increasing a slew rate of the amplified signal outputted to the output terminal on the basis of the input voltage value of the inverting input terminal and the input voltage value of the non-inverting input terminal, a fabrication cost of a product can be reduced, it can be easily integrated along with other ICs implemented through the CMOS, a large-capacity capacitive load can be driven at a high speed, and an input offset voltage among driving channels can be reduced when applied to a driving IC having a multi-drive channels.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

What is claimed is:

1. A CMOS operational amplifier comprising:
an amplifying unit for differentially amplifying signals inputted to an inverting input terminal and non-inverting input terminal to reduce an input offset voltage and outputting the amplified signal to an output terminal; and
a slew enhancing unit for increasing a slew rate of the amplified signal outputted to the output terminal of the amplifying unit on the basis of the input voltage value of the inverting input terminal and the input voltage value of the non-inverting input terminal,
wherein the amplifying unit comprises:
a first differential amplifier including the inverting input terminal and the non-inverting input terminal of the amplifying unit and for differentially amplifying a signal inputted to the inverting input terminal and the non-inverting input terminal;
a symmetrical amplifier for generating a signal symmetrical to the signal outputted from a non-inverting output terminal of the first differential amplifier and differentially amplifying the generated signal and the signal outputted from the non-inverting output terminal of the first differential amplifier; and an amplified signal output unit for differentially amplifying signals inputted from an inverting output terminal and a non-inverting output terminal of the symmetrical amplifier and outputting the amplified signals to the output terminal of the amplifying unit.

2. The amplifier of claim 1, wherein the amplifying unit and the slew enhancing unit are implemented by a plurality of CMOS (Complementary Metal Oxide Semiconductor).

3. The amplifier of claim 1, wherein the amplifying unit further comprises:
a compensator for guaranteeing a frequency stability through a frequency compensation of the amplifier.

4. The amplifier of claim 3, wherein the compensator includes a resister and a condenser connected in series to the resister.

5. The amplifier of claim 1, wherein the symmetrical amplifier comprises:
an input symmetry unit for generating the signal symmetrical to the signal outputted from the non-inverting output terminal of the first differential amplifier and outputting the generated signal; and
a second differential amplifier for differentially amplifying the signal outputted from the non-inverting output terminal of the first differential amplifier and the signal generated by the input symmetry unit.

6. The amplifier of claim 5, wherein the input symmetry unit amplifies a common voltage of signals inputted to the inverting input terminal and the non-inverting input terminal and generates the symmetrical signal.

7. The amplifier of claim 1, wherein the slew enhancing unit comprises:
a discharge controller for generating a signal for discharging a current charged in a capacitive load connected to the output terminal on the basis of the signal outputted from the non-inverting output terminal of the first differential amplifier and the signal generated by the symmetry amplifier;
a charge controller for generating a signal for charging a current to the capacitive load connected to the output terminal on the basis of the signal outputted from the inverting output terminal of the first differential amplifier; and
a discharge/charge driving unit for discharging a current charged in the capacitive load connected to the output terminal of the amplifying unit or charging a current to the capacitive load on the basis of the signals generated from the discharge controller and the charge controller.

8. The amplifier of claim 7, wherein when an input voltage value of the inverting input terminal is greater than an input voltage value of the non-inverting input terminal and a voltage difference between the inverting input terminal and the non-inverting input terminal is greater than a prescribed voltage, the discharge controller discharges a current charged in the capacitive load.

9. The amplifier of claim 8, wherein when the input voltage value of the inverting input terminal is greater than the input voltage value of the non-inverting input terminal and the voltage difference between the inverting input terminal and the non-inverting input terminal is smaller than a prescribed voltage, the discharge controller stops discharging of the current charged in the capacitive load.

10. The amplifier of claim 7, wherein when the input voltage value of the non-inverting input terminal is greater than the input voltage value of the inverting input terminal and the voltage difference between the inverting input terminal and the non-inverting input terminal is greater than a prescribed voltage, the charge controller charges a current into the capacitive load.

11. The amplifier of claim 10, wherein when the input voltage value of the non-inverting input terminal is greater than the input voltage value of the inverting input terminal and the voltage difference between the inverting input terminal and the non-inverting input terminal is smaller than a prescribed voltage, the charge controller stops charging of the current into the capacitive load.

12. The amplifier of claim 10, wherein the capacitive load is each pixel of an LCD (Liquid Crystal Display) connected to the output terminal of the amplifying unit.

13. An operational amplifier comprising:
a first differential amplifier for differentially amplifying a signal inputted to an inverting input terminal and a non-inverting input terminal of the first differential amplifier;
a symmetrical amplifier including an input symmetry unit for generating a signal symmetrical to a signal outputted from a non-inverting output terminal of the first differential amplifier and outputting the generated signal, and including a second differential amplifier for differentially amplifying the signal outputted from the non-inverting output terminal of the first differential amplifier and the signal generated by the input symmetry unit; and
an amplified signal output unit for differentially amplifying signals inputted from an inverting output terminal and a non-inverting output terminal of the symmetrical amplifier and outputting the amplified signals to an output terminal of the amplified signal output unit; a slew enhancing unit for increasing a slew rate of the amplifier signal outputted to the output terminal of the amplified signal output unit based on the input voltage values of the inverting and non-inverting input terminals of the first differential amplifier.

14. The operational amplifier of claim 13, wherein the first differential amplifier, the symmetrical amplifier and the slew enhancing unit include a plurality of CMOS (Complementary Metal Oxide Semiconductor).

15. The operational amplifier of claim 13, further comprising:
a compensator for providing a frequency stability through a frequency compensation of the operational amplifier.

16. The operational amplifier of claim 15, wherein the compensator includes a resister and a condenser connected in series to the resister.

17. The operational amplifier of claim 13, wherein the input symmetry unit amplifies a common voltage of signals inputted to the inverting and non-inverting input terminals of the first differential amplifier and generates the symmetrical signal.

18. The operational amplifier of claim 13, wherein the slew enhancing unit comprises:
a discharge controller for generating a signal for discharging a current charged in a capacitive load connected to the output terminal of the amplified signal output unit based on the signal outputted from the non-inverting output terminal of the first differential amplifier and the signal generated by the symmetrical amplifier;
a charge controller for generating a signal for charging a current to the capacitive load connected to the output terminal of the amplified signal output unit based on the signal outputted from the inverting output terminal of the first differential amplifier; and a discharge/charge driving unit for discharging a current charged in the capacitive load connected to the output terminal of the amplified signal output unit or charging a current to the capacitive load based on the signals generated from the discharge controller and the charge controller.

19. The operational amplifier of claim 18, wherein when an input voltage value of the inverting input terminal is greater than an input voltage value of the non-inverting input terminal and a voltage difference between the inverting and the non-inverting input terminals is greater than a prescribed voltage, the discharge controller discharges a current charged in the capacitive load.

20. The operational amplifier of claim 19, wherein when the input voltage value of the inverting input terminal is greater than the input voltage value of the non-inverting input terminal and the voltage difference between the inverting and non-inverting input terminals is smaller than a prescribed voltage, the discharge controller stops discharging of the current charged in the capacitive load.

21. The operational amplifier of claim 18, wherein when the input voltage value of the non-inverting input terminal is greater than the input voltage value of the inverting input terminal and the voltage difference between the inverting and non-inverting input terminals is greater than a prescribed voltage, the charge controller charges a current into the capacitive load.

22. The operational amplifier of claim 21, wherein when the input voltage value of the non-inverting input terminal is greater than the input voltage value of the inverting input terminal and the voltage difference between the inverting and non-inverting input terminals is smaller than a prescribed voltage, the charge controller stops charging of the current into the capacitive load.

23. The operational amplifier of claim 22, wherein the capacitive load corresponds to a pixel of an LCD (Liquid Crystal Display) connected to the output terminal of the amplifier.

* * * * *